United States Patent
Asada et al.

[11] Patent Number: 5,871,840
[45] Date of Patent: Feb. 16, 1999

[54] NICKEL POWDER CONTAINING A COMPOSITE OXIDE OF LA AND NI AND PROCESS FOR PREPARING THE SAME

[75] Inventors: Eiichi Asada, Tokyo; Yuji Akimoto, Fukuoka; Kazuro Nagashima, Ohnojo, all of Japan

[73] Assignee: Shoei Chemical Inc., Tokyo, Japan

[21] Appl. No.: 933,921

[22] Filed: Sep. 23, 1997

[30] Foreign Application Priority Data

May 26, 1997 [JP] Japan ..................................... 9-149949

[51] Int. Cl.⁶ ................................ B32B 5/16; B05D 7/00
[52] U.S. Cl. .................... 428/328; 427/212; 427/216; 427/226; 427/229; 428/403; 428/404; 428/701; 428/702
[58] Field of Search ..................... 428/403, 404, 428/328, 701, 702; 427/212, 216, 226, 229

[56] References Cited

U.S. PATENT DOCUMENTS

| | | | |
|---|---|---|---|
| 3,883,346 | 5/1975 | Martin | 75/0.5 BA |
| 3,918,933 | 11/1975 | Martin | 55/16 |
| 5,126,915 | 6/1992 | Pepin et al. | 361/304 |
| 5,439,502 | 8/1995 | Kodas et al. | 75/365 |
| 5,631,044 | 5/1997 | Rangaswamy et al. | 427/216 |

FOREIGN PATENT DOCUMENTS

| | | |
|---|---|---|
| 0 091 109 | 10/1983 | European Pat. Off. . |
| 63-31522 | 6/1988 | Japan . |
| 06290985 A | 10/1994 | Japan . |
| 6-279816 | 10/1994 | Japan . |
| 9-129028 | 5/1997 | Japan . |

OTHER PUBLICATIONS

Chemical Abstracts, vol. III, No. 8, Aug. 21, 1989, Abstract No. 61062, Furukawa, Sanehiro et al: "Anodes for molten–carbonate fuel cells "Abstract of JP 01 107 456 A.

*Primary Examiner*—Hoa T. Le
*Attorney, Agent, or Firm*—Flynn, Thiel, Boutell & Tanis, P.C.

[57] ABSTRACT

A nickel powder having a composite oxide layer comprising lanthanum and nickel and, optionally an oxide of chromium, on at least a part of the surface thereof. The nickel powder is produced by a process comprising the steps of: bringing a solution comprising at least one heat-decomposable nickel compound and at least one heat-decomposable lanthanum compound and, optionally, at least one heat-decomposable chromium compound, to fine droplets; and heating the droplets at a temperature above the decomposition temperatures of these compounds to prepare a nickel powder and, at the same time, to deposit a composite oxide layer comprising lanthanum and nickel and, when present, chromium oxide, in the vicinity of the surface of the nickel powder. The nickel powder is suitable for use in a conductor paste to be co-fired with unfired ceramic green sheets for a multilayer component or the like because the sintering initiation of the powder is effectively delayed to around the sintering initiation temperature of the ceramic green sheets, thereby preventing the problems caused due to excessive sintering.

7 Claims, No Drawings

NICKEL POWDER CONTAINING A COMPOSITE OXIDE OF LA AND NI AND PROCESS FOR PREPARING THE SAME

BACKGROUND OF THE INVENTION

1. Field of the Invention

The present invention relates to a novel nickel powder suitable for a thick film conductor paste and a process for preparing the same, and also to a conductor paste using the nickel powder and a multilayer electronic component or a multilayer substrate comprising a conductor formed using the paste.

2. Description of the Prior Art

In the field of electronics, thick film pastes, such as conductor pastes and resistor pastes, have been used for the production of electronic circuits and components, such as resistors, capacitors, and IC packages. The thick film paste is prepared by homogeneously mixing and dispersing a conductive powder, such as a metal, an alloy, or metal oxide, optionally together with a vitreous binder or other additive (s), in an organic vehicle to prepare a paste. The paste, after application onto a substrate, is fired at a high temperature to form a conductor film or a resistor film.

Multilayer ceramic electronic components, such as multilayer capacitors and multilayer inductors, and multilayer ceramic substrates are generally prepared by alternately laminating an unfired ceramic green sheet, made of, for example, a dielectric material or a magnetic material, and an internal conductor paste layer to form a plurality of layers and co-firing the plurality of layers. Noble metals, such as palladium, silver-palladium, and platinum, have hitherto been mainly used as the internal conductor. In recent years, however, base metals, such as nickel, have attracted attention due to a demand for saving resources and the solution of problems, such as delamination, cracking and other unfavorable phenomena attributable to oxidation expansion during firing of palladium or silver-palladium.

In these multilayer components and multilayer substrates, there is a tendency that the number of layers constituting the multilayer structure is increased. For example, a multilayer capacitor having a multilayer structure of several hundred layers has been prepared. This has led to a demand for a reduction in thickness of each ceramic layer and a further reduction in thickness of each internal conductor layer. For example, when the thickness of the ceramic layer is about 3 $\mu$m, an internal conductor thickness of not more than 1 $\mu$m, preferably about 0.5 $\mu$m, is required because when the thickness is larger than the above value, the center portion of the laminate is thick, leading to the creation of structural defects and deteriorated reliability.

The conventional conductor paste using a nickel powder, however, has a problem that excessive sintering in the step of firing results in the formation of an internal conductor of a discontinuous film, leading to an increased resistance value and breaking and, in addition, aggregation of the nickel powder results in an increased thickness of the conductor, limiting the reduction of the thickness of the film. Specifically, the nickel powder, particularly when fired in an inert atmosphere or a reducing atmosphere for preventing oxidization of the nickel powder, initiates sintering in an early stage, that is, initiates sintering and shrinking at a low temperature of 400° C. or below, even in the case of a single crystal powder having a relatively low activity. On the other hand, the temperature at which the ceramic layer initiates sintering is generally much above this temperature, for example, about 1,200° C. in the case of barium titanate. Therefore, the nickel and the ceramic layer, even when co-fired, do not shrink simultaneously, and the nickel film is pulled toward the face. Therefore, it is considered that small voids created in the nickel film in the course of sintering at a relatively low temperature are likely to become large with the progress of the sintering in a high temperature region and that the aggregation of the nickel powder causes the film to be grown in the thicknesswise direction.

For this reason, what is needed for achieving the reduction in the thickness of the internal conductor layer of nickel is considered to further reduce the size of the nickel powder and to improve the dispersibility of the nickel powder to minimize the creation of voids during sintering and, in addition, to allow the sintering-shrinking behavior of the nickel layer to coincide with that of the ceramic layer.

Further, the uncoincidental sintering-shrinking behavior between the conductor layer and the ceramic layer, particularly when the film thickness is large, is causative of the creation of structural defects such as delamination and cracking, resulting in a lowering in yield and reliability.

An increase in the resistance value and creation of structural defects attributable to similar excessive sintering raise a problem also in the co-firing of an external conductor and the above layers.

Various studies have hitherto been made with a view of retarding the sintering of the conductors until the temperature reaches the sintering initiation temperature of the ceramic layer.

Examples of the proposed methods include the addition of metal oxide particles, such as particles of titanium oxide, zirconium oxide, barium oxide, or iron oxide or a precursor compound capable of producing the above oxide during firing to the conductor paste, or coating of the metal powder with the above metal oxide particles or precursor thereof. The above oxide is an insulator, and the addition thereof in a large amount results in a lowering in conductivity.

Further, the addition of a large amount of a ceramic powder having the same composition as that used in the ceramic layer can apparently delay the initiation of the shrinking of the conductor film to about 800° C. In this case, however, since sintering of the metal powder per se is not inhibited, sintering at a high temperature of about 1,300° C. results in loss of continuity and conductivity of the conductor film.

SUMMARY OF THE INVENTION

An object of the present invention is to effectively inhibit the sintering of a nickel powder at a low temperature and, even in the case of a small thickness, to provide a conductor film having a high conductivity.

In particular, in the case of a conductor paste which is co-fired with the unfired ceramic layer for a multilayer component or the like, an object of the present invention is to bring the sintering initiation temperature of the nickel powder to the sintering initiation temperature of the ceramic layer as much as possible without sacrificing the conductivity, thereby approximating the shrinking behavior to that of the ceramic to prevent the creation of breaking or structural defects of the conductor film caused by excessive sintering and enabling the film thickness to be reduced.

Another object of the present invention is to provide a simple and improved process for preparing the above nickel powder.

Thus, according to one aspect of the present invention, there is provided a nickel powder having a composite oxide layer, comprising lanthanum and nickel, on at least a part of the surface thereof, and further, the nickel powder optionally contains an oxide of chromium.

According to another aspect of the present invention, there is provided a process for preparing a nickel powder having a composite oxide layer comprising lanthanum and nickel on at least a part of the surface thereof, the nickel powder optionally containing an oxide of chromium, the process comprising the steps of: bringing a solution comprising at least one heat-decomposable nickel compound and at least one heat-decomposable lanthanum compound, or comprising the at least one nickel compound the at least one lanthanum compound, and at least one heat-decomposable chromium compound, to fine droplets; and heating the droplets at a temperature above the decomposition temperatures of the nickel compound and the lanthanum compound or, when the chromium compound is present, at a temperature above the decomposition temperatures of the nickel compound, the lanthanum compound and the chromium compound to prepare a nickel powder and, at the same time, to deposit a composite oxide layer comprising lanthanum and nickel or the composite oxide layer and chromium oxide in the vicinity of the surface of the nickel powder.

Further, the present invention provides a conductor paste comprising the above nickel powder, a multilayer ceramic electronic component and a multilayer ceramic substrate each comprising a conductor layer formed using the above conductor paste.

DETAILED DESCRIPTION OF THE PREFERRED EMBODIMENTS

The composite oxide may cover the surface of the nickel powder or may be segregated in a high concentration on and/or in the vicinity of the surface of the nickel powder, and what is required in this case is the presence of the composite oxide, in the vicinity of the surface, in such a form as will be effective in retarding the sintering of the nickel powder. The covering of the whole surface with the composite oxide is considered most effective for preventing the contact among the nickel metal particles. However, the presence of the composite oxide, on the surface of the nickel powder, in an effective amount determined by the applications, firing atmosphere, required properties and the like, suffices for the contemplated effect, even though the whole surface is not always covered with the composite oxide.

The composite oxide contains at least lanthanum and nickel, and examples thereof include those having structures of $LaNiO_3$, $La_2NiO_4$, $La_3Ni_2O_7$ and the like.

Since these are ceramics, the sintering behavior is similar to that of a ceramic green sheet. For a nickel powder having this composite oxide on the surface thereof, sintering in a low temperature region is inhibited and, depending upon the amount of the oxide, can be delayed to the initiation of sintering around the sintering initiation temperature of the ceramic, preventing excessive sintering. This can prevent the increase in conductor resistivity, breaking, increase in film thickness, delamination and other unfavorable phenomena attributable to uncoincidental shrinkage, at the time of co-firing, between the conductor layer and the ceramic layer, realizing the formation of a nickel conductor having a small thickness and good conductivity and adhesion. This in turn enables the thickness of the conductor layer in a multilayer component or the like to be reduced.

Among the above composite oxides, particularly $LaNiO_3$ having a perovskite structure is a conductive ceramic having a high conductivity, and the other composite oxides are also conductive. Therefore, the composite oxides are far superior to the conventional sintering retardant in that the resistivity of the conductor is not increased.

It is considered that chromium is present, in the form of an oxide such as $Cr_2O_3$ or $LaCrO_3$, mainly in the composite oxide layer, enhancing the effect of delaying the initiation of the sintering.

The composite oxide layer may be formed by any method. Examples thereof include a method wherein a lanthanum compound or the like is deposited on the surface of the nickel powder by a wet process, such as a sol-gel process, and then calcined to form a composite compound layer, a spray pyrolysis method, and a method wherein a nickel powder and a composite oxide are mechanically mixed together to deposit the composite oxide.

Preferably, the powder of the present invention is produced by the spray pyrolysis method. As described in Japanese Patent Publication No. 31522/1988 and Japanese Patent Laid-Open No. 279816/1994, in the spray pyrolysis method, a solution containing at least one metal compound is atomized to form fine droplets and the droplets are heated at a temperature above the decomposition temperature of the metal compound, preferably a temperature around the melting point of the metal or above to heat decompose the metal compound, thereby depositing a powder of the metal or an alloy thereof.

This method can provide a nickel powder having good crystallinity, high density and high dispersibility, easily control the particle size and enables the nickel powder having a composite oxide layer according to the present invention to be prepared in one stage by previously adding a lanthanum compound or the like to a starting nickel compound solution, advantageously eliminating the need to additionally provide the step of coating. Specifically, the lanthanum or lanthanum oxide deposited by the heat decomposition, because the resultant nickel particle has good crystallinity, is expelled from the interior of the particle to form a composite oxide in the vicinity of the surface. Further, the composite oxide is relatively evenly deposited on the surface, and, hence, use thereof in a very small amount suffices for the contemplated effect. In the spray pyrolysis method, the composition of the formed particle basically corresponds to the composition of the metal compound in the solution, facilitating the regulation of the composition, which renders this method suitable for the preparation of the nickel powder according to the present invention.

When a chromium compound is incorporated into the starting solution, chromium is mainly present, in the form of an oxide or a composite oxide with lanthanum, in the composite oxide layer. In this case, a part of the chromium is considered to be dissolved in a solid solution state in nickel.

According to the process of the present invention, the nickel compound is at least one heat-decomposable compound selected from the group consisting of a salt of nitric acid, a salt of sulfuric acid, a chloride, an ammonium complex, a salt of phosphoric acid, a salt a of carboxylic acid, a metal alcoholate, a metal resinate and the like. It is also possible to use a double or complex salt. The lanthanum and chromium compounds may also be selected from the group consisting of compounds, such as a salt of nitric acid, a salt of sulfuric acid, a chloride, an ammonium complex, a salt of phosphoric acid, a salt of a carboxylic acid, a metal alcoholate, a metal resinate, a complex salt and the like.

These metal compounds are dissolved in water, an organic solvent, such as an alcohol, acetone, or an ether, or a mixed solvent thereof, to prepare a solution, and the solution is formed into fine droplets through an atomizer, such as an ultrasonic atomizer or a twin-fluid atomizer, followed by heating at a temperature above the decomposition temperatures of the metal compounds to conduct heat decomposition. Preferably, the heating treatment is conducted at the melting point of nickel or a higher temperature. However, a temperature about 200° C. below the melting point suffices for the expelling effect. In particular, when a high density, homogeneous shape or the like is not required, the heating temperature may be considerably below the melting point. The heating is conducted in an atmosphere which does not substantially oxidize the nickel powder, such as a reducing or inert atmosphere, preferably a weakly reducing atmosphere containing hydrogen or carbon monoxide.

The composite oxide in an amount as small as about 0.01% by weight in terms of $La_2O_3$, based on nickel, can offer the effect. Preferably, the amount of composite oxide is not less than 0.1% by weight in terms of $La_2O_3$, based on nickel. The composite oxide in a large amount poses no problem because it is conductive. In the preparation of the nickel powder by spray pyrolysis, however, the composite oxide in an excessively large amount is less likely to be segregated on the surface of the nickel powder, offering no marked improvement in the effect of retarding the sintering. Further, a lowering in the fraction of nickel results in a deteriorated conductivity. For the above reason, the amount of the composite oxide is preferably up to about 50% by weight in terms of $La_2O_3$, based on nickel, from the practical viewpoint.

The oxide of chromium, even in a small amount, can offer the contemplated effect. When the amount of the oxide of chromium is excessively large, the sinterability is lost. Therefore, the oxide of chromium is added in such an amount as will not deteriorate the sinterability of nickel. The amount of the oxide of chromium is preferably up to an amount equal (by weight), in terms of $Cr_2O_3$, to that of $La_2O_3$.

The conductor paste comprising the nickel powder of the present invention as a conductor component may be prepared by homogeneously mixing and dispersing the nickel powder in an organic vehicle according to a conventional method. If necessary, other conductive powders, inorganic binders such as a glass powder, and other additives may be added.

The nickel powder of the present invention is suitable for co-firing with ceramics, particularly in the manufacturing of internal and external conductors of multilayer components and multilayer substrates. It, however, may be used for a usual thick film conductor paste.

The present invention will be described in more detail with reference to the following Examples and Comparative Examples.

EXAMPLES 1 to 9

Nickel nitrate hexahydrate was dissolved in water to a nickel concentration of 50 g/liter, and lanthanum nitrate was added in an amount specified in Table 1 of 0.01 to 20% by weight in terms of $La_2O_3$, based on the nickel element, to prepare starting solutions.

The starting solution thus prepared was brought to fine droplets through an ultrasonic atomizer, and the droplets were fed with the aid of a gas, regulated to have a weakly reducing property, as a carrier into a ceramic tube heated to 1,500° C. in an electric furnace. The droplets were heat decomposed in the course of passing through a heating zone to prepare a nickel powder containing lanthanum oxide.

Further, the powders thus prepared were each dissolved in nitric acid, and the concentration of lanthanum in the powder was determined by ICP(inductively coupled plasma) emission spectroscopy. As a result, the lanthanum concentration was in agreement with that in the composition of the starting solution.

For the powders, the results of X-ray diffraction, observation under high resolution FE-SEM (field emission-scanning electron microscope) and electron diffraction showed that a crystalline phase of at least one of $LaNiO_3$, $La_2NiO_4$, and $La_3Ni_2O_7$ was present on the surface of the nickel particles.

Comparative Example 1

A pure nickel powder was prepared in the same manner as in Example 1, except that lanthanum was not added.

For the nickel powders prepared in Examples 1 to 9 and the nickel powder of Comparative Example 1 not containing lanthanum, thermomechanical analysis (TMA) was conducted to evaluate the sintering behavior of the powders, and the shrinking initiation temperature in the sintering and the shrinking termination temperature in the sintering are summarized in Table 1. As is apparent from Table 1, when lanthanum was not added, the shrinking in the sintering gradually began at 300° C., whereas the addition of lanthanum resulted in an about 200 to 600° C. increase in the shrinking initiation temperature. Further, it is apparent that the termination of the shrinking could be delayed by not less than 300° C.

EXAMPLES 10 to 14

To a 50 g nickel/liter aqueous solution of nickel nitrate hexahydrate were added lanthanum nitrate in an amount of 0.8% by weight in terms of $La_2O_3$, based on nickel, and chromium nitrate in an amount of 0.01 to 0.8% by weight in terms of $Cr_2O_3$, based on nickel, as specified in Table 1, thereby preparing starting solutions.

Nickel powders having a composite oxide layer comprising lanthanum, chromium and nickel on the surface thereof were prepared in the same manner as in Example 1, except that the starting solutions prepared just above were used.

The shrinking initiation temperature and the shrinking termination temperature were measured by TMA analysis and the results are also given in Table 1.

TABLE 1

|  | Amt. of lanthanum added (wt %) | Amt. of chromium added (wt %) | Shrinking initiation temp. in sintering (°C.) | Shrinking termination temp. in sintering (°C.) |
| --- | --- | --- | --- | --- |
| Ex. 1 | 0.01 | — | 535 | 880 |
| Ex. 2 | 0.1 | — | 600 | 1000 |
| Ex. 3 | 0.2 | — | 635 | 1000 |
| Ex. 4 | 0.5 | — | 640 | 1000 |
| Ex. 5 | 0.7 | — | 640 | 1000 |
| Ex. 6 | 0.8 | — | 810 | 1000 |
| Ex. 7 | 4.0 | — | 810 | 1100 |
| Ex. 8 | 7.0 | — | 850 | 1250 |
| Ex. 9 | 20.0 | — | 900 | ≧1300 |
| Ex. 10 | 0.8 | 0.01 | 845 | ≧1300 |
| Ex. 11 | 0.8 | 0.05 | 900 | ≧1300 |
| Ex. 12 | 0.8 | 0.1 | 920 | ≧1300 |
| Ex. 13 | 0.8 | 0.5 | 925 | ≧1300 |
| Ex. 14 | 0.8 | 0.8 | 945 | ≧1300 |
| Comparative Ex. 1 | — | — | 330 | 600 |

EXAMPLES 15 to 17

Nickel powders having a composite oxide layer on the surface thereof were prepared in the same manner as in Example 11, except that the temperature of the electric furnace was 1,400° C., 1,300° C., or 1,600° C.

The results of TMA analysis for the shrinking initiation temperatures for the nickel powders were 900° C., 890° C., and 910° C., respectively. For all the nickel powders, the shrinking termination temperature was 1,300° C. or above.

EXAMPLE 18

The nickel powders prepared in Examples 3, 6, 9 and 11 and Comparative Example 1 were milled with an organic vehicle to prepare pastes. Each of the pastes was printed on a $BaTiO_3$-based ceramic green sheet to form a conductor pattern at a nickel coverage of 0.5 mg/cm$^2$, followed by drying and then co-firing at 1,300° C.

The conductor film thickness and the resistivity are given in Table 2.

For the conductor using the powder prepared in Comparative Example 1, breaking occurred due to excessive sintering and, although the film thickness in a portion where nickel was present was 2.0 μm, continuity could not be provided. On the other hand, for the powders prepared in Examples 3, 6, 9 and 11, no excessive sintering was observed, and, as is apparent from Table 2, both the film thickness and the resistivity were small. In particular, for Example 11 wherein chromium was added, the resistivity value was as low as 20 μΩ·cm, despite the fact that the film thickness was as small as 0.5 μm.

TABLE 2

| Nickel powder | Thickness of fired film (μm) | Resistivity (μΩ· cm) |
|---|---|---|
| Ex. 3 | 0.8 | 50 |
| Ex. 6 | 0.6 | 35 |
| Ex. 9 | 0.6 | 55 |
| Ex. 11 | 0.5 | 20 |
| Comparative Ex. 1 | 2.0 | ∞ |

According to the nickel powder of the present invention, the sintering at a low temperature can be inhibited and the initiation of shrinking at the time of firing of the nickel paste can be delayed to a temperature around which sintering of the ceramic is initiated.

Therefore, in particular, in multilayer components and multilayer substrates, the shrinking behavior of the nickel conductor layer can be approximated to that of the ceramic layer without sacrificing the conductivity. This can prevent breaking and structural defects of the conductor film and realizes the preparation of highly reliable, high-performance products and, in addition, enables a reduction in thickness of the internal conductor layer, realizing a further reduction in size and increase in the number of layers constituting the multilayer structure.

What is claimed is:

1. A nickel powder having a composite oxide layer comprising lanthanum and nickel on at least a part of the surface thereof.

2. A process for preparing a nickel powder according to claim 1, comprising the steps of: bringing a solution comprising at least one heat-decomposable nickel compound and at least one heat-decomposable lanthanum compound to fine droplets; and heating the droplets at a temperature above the decomposition temperatures of the nickel compound and the lanthanum compound to prepare a nickel powder and, at the same time, deposit a composite oxide layer comprising lanthanum and nickel in the vicinity of the surface of the nickel powder.

3. A nickel powder having a composite oxide layer comprising lanthanum and nickel and an oxide of chromium on at least a part of the surface thereof.

4. A process for preparing the nickel powder according to claim 3, comprising the steps of: bringing a solution comprising at least one heat-decomposable nickel compound, at least one heat-decomposable lanthanum compound and at least one heat-decomposable chromium compound to fine droplets; and heating the droplets at a temperature above the decomposition temperatures of the nickel compound, the lanthanum compound and the chromium compound prepare a nickel powder and, at the same time, to deposit a composite oxide layer comprising lanthanum and nickel and an oxide of chromium in the vicinity of the surface of the nickel powder.

5. A conductor paste comprising a nickel powder selected from the group consisting of a nickel powder having a composite oxide layer comprising lanthanum and nickel on at least a part of the surface thereof and a nickel powder having a composite oxide layer comprising lanthanum and nickel and an oxide of chromium on at least a part of the surface thereof.

6. A multilayer ceramic electronic component comprising a conductor layer formed using the conductor paste according to claim 5.

7. A multilayer ceramic substrate comprising a conductor layer formed using the conductor paste according to claim 5.

* * * * *

UNITED STATES PATENT AND TRADEMARK OFFICE
CERTIFICATE OF CORRECTION

PATENT NO. : 5 871 840
DATED : February 16, 1999
INVENTOR(S) : Eiichi ASADA et al It is certified that error appears in the above-identified patent and that said Letters Patent is hereby corrected as shown below:

Column 8, line 31; change "compound prepare" to ---compound to prepare---.
  line 32, delete "to"

Signed and Sealed this

Twenty-first Day of September, 1999

Attest:

Q. TODD DICKINSON

*Attesting Officer*  *Acting Commissioner of Patents and Trademarks*